(12) United States Patent
West

(10) Patent No.: US 7,943,514 B2
(45) Date of Patent: May 17, 2011

(54) INTEGRATED CIRCUITS HAVING TSVS INCLUDING METAL GETTERING DIELECTRIC LINERS

(75) Inventor: Jeffrey A West, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/553,879

(22) Filed: Sep. 3, 2009

(65) Prior Publication Data
US 2011/0049717 A1    Mar. 3, 2011

(51) Int. Cl.
*H01L 21/44* (2006.01)
(52) U.S. Cl. .. 438/667; 438/622; 438/666; 257/E21.597
(58) Field of Classification Search .......... 438/613–614, 438/622, 625, 666–668; 257/E21.597
See application file for complete search history.

(56) References Cited

U.S. PATENT DOCUMENTS
7,843,064 B2 * 11/2010 Kuo et al. .................. 257/758

OTHER PUBLICATIONS

Singer, Peter "Grain Structure Key to Preventing Cu Diffusion" Semiconductor International; www.semiconductor.net Jul. 1, 1998.

* cited by examiner

*Primary Examiner* — Thanhha Pham
(74) *Attorney, Agent, or Firm* — Yingsheng Tung; Wade J. Brady, III; Frederick J. Telecky, Jr.

(57) ABSTRACT

An IC includes a substrate having a semiconductor top surface and a bottom surface, wherein the semiconductor top surface includes one or more active circuit components and a plurality of through silicon vias (TSVs) extending through the substrate. The plurality of TSVs include an outer dielectric liner. The dielectric liner includes at least one halogen or a Group 15 element metal gettering agent in an average concentration from 1 to 10 atomic %. A metal diffusion barrier layer is on the dielectric liner and a metal filler is on the metal barrier layer. The metal gettering agent getters metal filler that escapes the metal barrier layer.

14 Claims, 4 Drawing Sheets

INTEGRATED CIRCUITS HAVING TSVS INCLUDING METAL GETTERING DIELECTRIC LINERS

FIELD

Disclosed embodiments relate to integrated circuits (ICs) having through-substrate vias that include a metal filler metal, a metal barrier and a dielectric liner.

BACKGROUND

As known in the art, through-substrate vias (referred to herein as TSVs), which are commonly referred to as through-silicon vias, are vertical electrical connections that extend from one of the electrically conductive levels formed on the top surface of the IC die (e.g., one of the metal interconnect levels) to the backside (bottom) surface of the IC die. TSVs are used as power TSVs (e.g., for VDD, VSS or ground) and/or signal TSVs. Signal TSVs are generally formed close to active circuitry, such as within 5 to 20 µm from the active circuitry. The TSV planar (x-y) dimensions can be about 5 to 50 µm, with aspect ratios (ARs) from about 5:1 to 20:1.

TSVs allow the TSV comprising IC to be bonded on both sides and utilize vertical electrical paths to couple to other IC devices (e.g., on a die, wafer) or to mount to a package substrate positioned below the IC die. The vertical electrical paths are significantly shortened relative to conventional wire bonding technology, generally leading to significantly faster device operation of the IC.

TSVs can be formed in a "via-first," a "via-middle," or a "via-last" approach. In the via-first approach the TSVs are formed in the wafer fab during front end processing. Via-first can comprise TSV formation before transistors are formed. Via-middle can take place after transistor formation, such as formed between the contact level and first metal, or after one or more levels of metal interconnect, but before passivation. In contrast, the via-last approach takes place in assembly and packaging and typically forms the TSVs from the bottom surface of the IC die after wafer processing is completed (i.e. after passivation processing).

In a typical via-first process, vias are formed to a depth (e.g., 10 to 300 µm) that is less than the full wafer thickness (e.g., 400 µm to about 775 µm for 12 inch wafers) using chemical etching, laser drilling, or one of several energetic methods, such as Reactive Ion Etching (RIE). Once the vias are formed, they are generally framed with a dielectric liner to provide electrical isolation from the surrounding semiconductor substrate. The dielectric liner is generally formed from silicon oxide, silicon nitride, or silicon oxynitride.

The vias are then made electrically conductive by filling the vias with an electrically conductive filler material (e.g., copper, tungsten or doped polysilicon) to form embedded TSVs. The bottom of the embedded TSV is generally referred to as an embedded TSV tip. In the case the electrically conductive filler materials comprises a metal, some metals (e.g., copper) are known to provide band gap states near the center of the semiconductor's band gap. As a result, such metals if highly mobile in the semiconductor can significantly degrade minority carrier lifetimes in the semiconductor, and cause problems such as significantly increased junction leakage or shift in transistor threshold voltage.

To prevent escape of the metal into the surrounding semiconductor, a diffusion barrier layer is generally deposited on the dielectric liner. The diffusion barrier layer generally comprises refractory-metal comprising materials such as titanium (Ti), titanium nitride (TiN), tantalum (Ta), tantalum nitride (TaN), or ruthenium (Ru). Such diffusion barrier layer layers are known to be effective against diffusion of most metals, including copper. Diffusion barrier layer films can be deposited by chemical vapor deposition (CVD), physical vapor deposition (PVD) also known as sputtering, evaporative deposition, or pulsed laser deposition. PVD processes are generally preferred due to lower cost as compared to CVD processes.

For via-first and via-middle processes, a backgrinding step is conventionally used to thin the wafer by removing a sufficient thickness of the substrate (e.g., 300 to 500 µm) from the bottom surface of the wafer to reach the embedded TSV tip to expose the electrically conductive filler material at the distal end of the TSV tip.

In a via-last process backgrinding generally takes place before via formation, and the TSVs are formed beginning at the bottom of the wafer. However, analogous to via-first processing, via-last processing generally includes a dielectric liner to provide electrical isolation to the surrounding semiconductor substrate, followed by filling the lined via with an electrically conductive filler material (e.g., copper), and a diffusion barrier layer between the TSV filler material and the dielectric liner when the TSV filler material comprises a fast diffusing and minority lifetime killing metal (e.g., copper).

SUMMARY

The Inventor has recognized that protrusions emerging from the sidewall of the TSVs or indentations in the sidewalls of TSV vias (collectively referred to herein as "sidewall planarity aberrations" abbreviated "SPAs") can create locations for poor diffusion barrier layer integrity. Poor diffusion barrier layer integrity results from locally insufficient diffusion barrier layer thickness, sometimes including the localized absence of the diffusion barrier layer on the TSV sidewall. Such diffusion barrier layer integrity issues have been found by the Inventor to be pronounced for diffusion barrier layers deposited by PVD processes (e.g. sputtering). Since poor diffusion barrier layer integrity can be present in via-first, via-middle, or via-last processes, embodiments of the invention are generally applicable whether the process is via-first, via-middle, or via-last.

Thin or no diffusion barrier layer present on localized portion(s) of the TSV sidewall can result from SPAs because sputter processes are known to provide line of sight deposition patterns. Accordingly, protrusions act as localized shadow masks. Indentations in the TSV sidewall, if sufficiently deep, will not be reached by the line of sight deposition pattern provided by PVD processes. Since typical PVD deposition conditions are low temperature, they result in little movement of the as-deposited diffusion barrier layer material. Accordingly, the line of sight deposited pattern can result in poor diffusion barrier layer integrity when significant SPAs are present.

For ICs including TSVs comprising a metal filler material (e.g., copper) that is fast diffusing and significantly degrades minority carrier lifetimes or shifts the transistor threshold voltage in the semiconductor (e.g., silicon), diffusion barrier integrity problems have been recognized by the Inventor to allow the escape of the metal filler into the semiconductor. For minority carrier lifetime degrading metal filler materials that provide one or more defect states near the center of the band gap of the semiconductor, escape of the metal filler into the semiconductor can result in problems such as transistor or memory degradation in the surrounding active circuitry.

Disclosed embodiments add at least metal gettering agent to the TSV dielectric liner to provide a dielectric liner that provides metal gettering of the TSV metal filler (e.g., copper) whenever it escapes the diffusion barrier layer. While the effectiveness of doped oxides for gettering alkali ions is well known, the effectiveness of doped oxides for gettering TSV filler metals, such as copper, is not recognized by those having ordinary skill in the art. Moreover, conventional processes for gettering metallic contaminants generally focus on creating defects or damage within a semiconductor wafer in a region where gettering is sought to occur, with the gettering regions generally being formed well below the regions of a wafer where device formation will ultimately occur and separated from such regions by an expanse of substrate.

Exemplary dielectric liners include silicon oxide, silicon oxynitride and certain polymer liners. Such gettering agents act as a second line of defense against the escape of the TSV metal filler (e.g., copper) to the semiconductor (e.g., silicon) that, as noted above, can otherwise degrade minority carrier lifetimes or shift the transistor threshold voltage in the semiconductor and thus the performance of the IC.

The metal gettering agent is generally in an anionic state (e.g., is oxidized) in the dielectric liner, so that the metal gettering agent has a significant local negative charge when present within the dielectric liner. The metal gettering agent generally comprises a halogen such as fluorine or an element from Group 15 of the periodic table ("pnictogens," formerly numbered as Group V or Group VA), such as phosphorus, arsenic, or antimony. The metal gettering agent is generally in a concentration from 1 to 10 atomic % in the dielectric liner and can be deposited in-situ with the dielectric liner.

DETAILED DESCRIPTION

Figure 1:
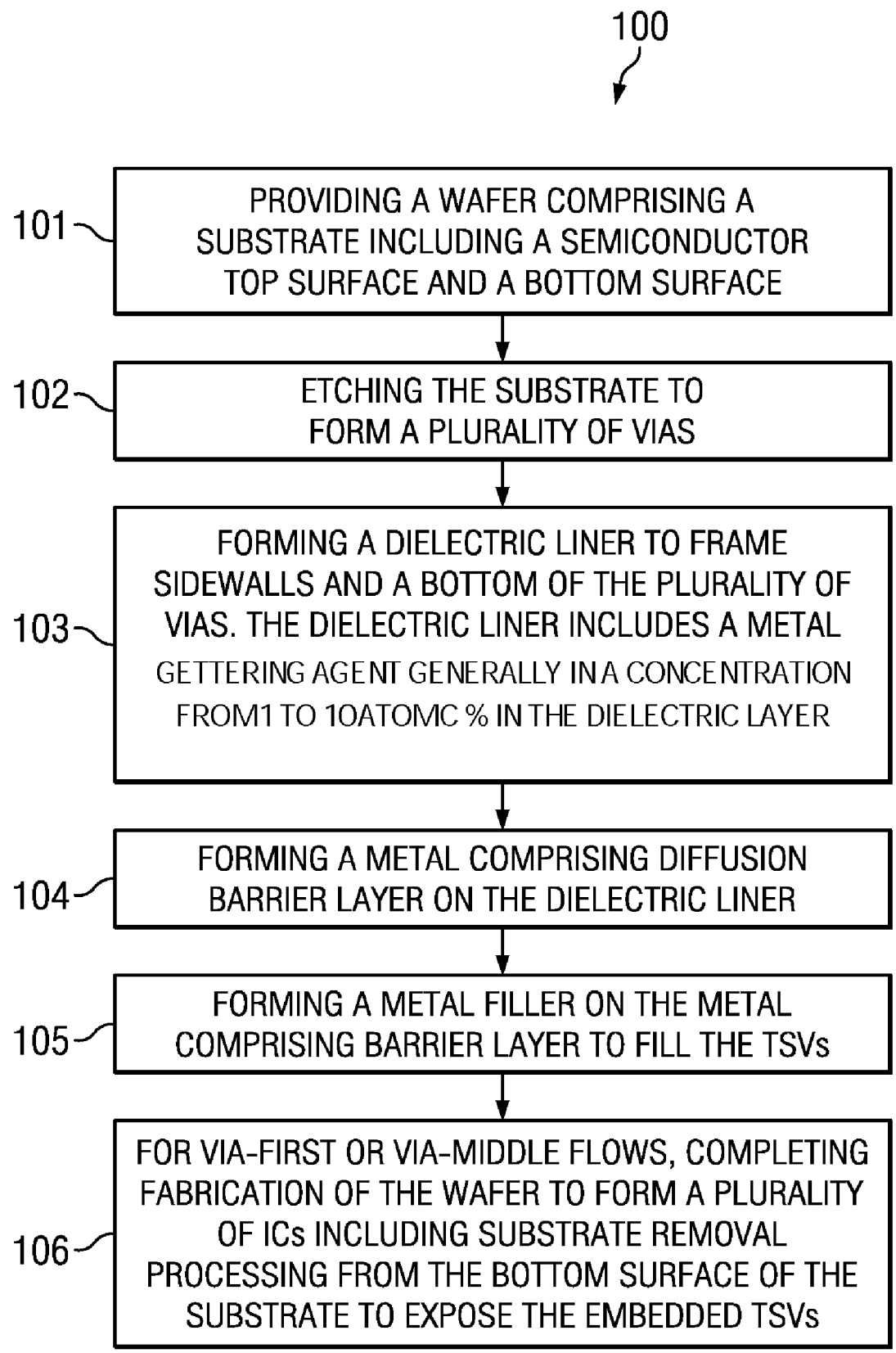
FIG. 1 shows steps in an exemplary method of forming an IC having TSVs that comprise a dielectric liner including at least one metal gettering agent for gettering metals, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

FIG. 1 shows steps in an exemplary method 100 of forming an IC having TSVs that comprise a dielectric liner including at least one metal gettering agent, according to an embodiment of the invention. As described above, the Inventor has recognized that SPAs can create locations for poor diffusion barrier layer integrity, which can allow escape of the TSV metal filler into the semiconductor where it can adversely impact IC performance. SPAs can comprise localized protrusions emerging from the sidewall of TSVs or local indentations on the sidewall of the TSVs.

Protrusions emerging from the sidewall of TSVs can result from a variety of different causes. For example, certain processes for deep reactive-ion etch (DRIE) generally result in significant waviness ("scalloping") along the surface of the TSV sidewall, and thus can produce local protrusions as well as local indentations. Another example of protrusions is particulates that can enter the via and become attached to the TSV sidewall. Local indentation may also occur during TSV etch for a via-middle process when undercut of the TSV sidewall near the interface between the pre-metal dielectric (i.e. the dielectric on the top semiconductor surface under the first metal) and semiconductor can result in recess of the semiconductor at this interface.

Step 101 comprises providing a wafer including a top surface and a bottom surface. The wafer may comprise any suitable material, for example, silicon, silicon-on-insulator (SOI), gallium arsenide (GaAs), or other material or combination of materials. In one embodiment, the bottom side of the wafer has been thinned prior to via formation. According to one embodiment, the thinned wafer has a thickness of between 25 μm and 150 μm.

Step 102 comprises etching the substrate to form a plurality of vias, wherein the vias having a depth of at least 10 μm, such as 30 to 100 μms. The etching can comprise DRIE. The aspect ratio (AR) of the etched via (and the resulting TSV) is generally from about 5:1 to 20:1, and in one embodiment is <10.

Step 102 and subsequent steps in method 100 can occur in a via-first flow before transistors are formed; a via-middle flow after transistor formation, such as formed between the contact level and first metal, or after one or more levels of metal interconnect, but before passivation processing; or in a via-last flow after wafer processing is completed (i.e. after passivation processing). In via-first and via-middle flows, the vias are first formed as embedded vias (i.e. do not reach the bottom surface of the wafer) and thus steps 103-105 described below form embedded TSVs.

Step 103 comprises forming a dielectric liner to frame sidewalls and a bottom of the plurality of vias. The thickness range for the dielectric liner is generally 0.1 μm-1 μm. The dielectric liner includes at least a portion having at least one metal gettering agent, wherein the metal gettering agent is generally in a concentration from 1 to 10 atomic % in the dielectric liner. The dielectric liner can comprise an oxide, oxynitride, or a polymeric dielectric. In some embodiments the dielectric liner comprises a phosphorus-doped oxide, an arsenic-doped oxide, or a fluorine-doped oxide.

In one embodiment the forming of the dielectric liner comprises depositing an initial (outer) dielectric liner portion with <1 atomic % of the metal gettering agent, and then depositing a second (inner) dielectric liner portion to provide the portion having at least one metal gettering agent in a concentration from 1 to 10 atomic %. In yet another embodiment, the forming of the dielectric liner comprises forming an outer dielectric liner portion with <1 atomic % of a metal gettering agent, a center dielectric liner having the metal gettering agent in a concentration from 1 to 10 atomic %, and then inner dielectric liner portion with <1 atomic % of an metal gettering agent to sandwich the center dielectric liner between the inner and outer dielectric liner portions.

Concentrations above approximately 5 to 10 atomic % for most metal gettering agents can trigger segregation of the metal gettering agent, such as formation of $P_2O_5$ crystals for silicon oxide dielectrics at a level from about 6 to 7.9 atomic % phosphorus, or potentially harmful unbound fluorine when the level exceeds about 5 atomic %.

Step 104 comprises forming a metal comprising diffusion barrier layer on the dielectric liner. As known in the art, a metal comprising diffusion barrier layer thickness of about at least 4 nm is generally sufficient to provide metal blocking. However, when SPAs are present on the sidewalls of the TSV and a PVD barrier layer deposition process is used, the Inventor has recognized the barrier layer thickness proximate to the SPAs can be significantly less than the nominal deposition thickness that is generally provided on planar portion of the TSV sidewall.

The metal comprising diffusion barrier layer comprises titanium, titanium nitride, tantalum, tantalum nitride, manganese, ruthenium or combinations thereof. The metal comprising diffusion barrier layer is generally refractory metal comprising and can also serve the function of a seed layer. For electroplated copper, ruthenium is the only material on the listing above that can act as a seed layer.

Forming a metal comprising barrier layer can comprise a physical vapor deposition (PVD) process, which generally results in a line-of-sight deposition pattern. PVD, rather than involving a chemical reaction at the surface to be coated as in CVD, involves purely physical processes such as plasma sputter bombardment in which a glow plasma discharge (usually localized around the "target" by a magnet) bombards the material sputtering some away as a vapor. Less common variants of PVD include evaporative deposition in which the material to be deposited is heated to a high vapor pressure by electrically resistive heating, electron beam physical vapor deposition in which the material to be deposited is heated to a high vapor pressure by electron bombardment in a high vacuum, cathodic arc deposition in which a high power arc directed at the target material blasts away some into a vapor, and pulsed laser deposition in which a high power laser ablates material from the target into a vapor.

Step 105 comprises forming a metal filler on the metal comprising barrier layer to fill the TSVs. In one embodiment the metal filler comprises copper. Step 106 applies to via-first or via-middle flows and comprises completing fabrication of the wafer to form a plurality of ICs. Step 106 can comprise substrate removal processing (e.g., polishing and etching) from the bottom surface of the wafer to expose the embedded TSVs.

Although not seeking to be bound by theory, with the theory not necessary to practice embodiments of the invention, Applicant provides a theory to explain the efficacy of embodiments of the invention that also helps define operable metal gettering agents and dielectric liner combinations. Metal gettering agents in dielectric liners are those that support significant local negative charge of the metal gettering agent which represents favorable sites for attracting and trapping highly mobile positive ions. As described above, copper exists as a cation and is highly mobile in semiconductors such as silicon, and in dielectric materials such as silicon dioxide, and as a result of diffusion barrier integrity issues described above can diffuse from the metal filler material core of the TSV outward to the dielectric liner. Without the metal gettering dielectric liners disclosed herein, highly mobile positive ions such as copper can otherwise escape into the semiconductor and compromise the IC performance.

Figure 2A:
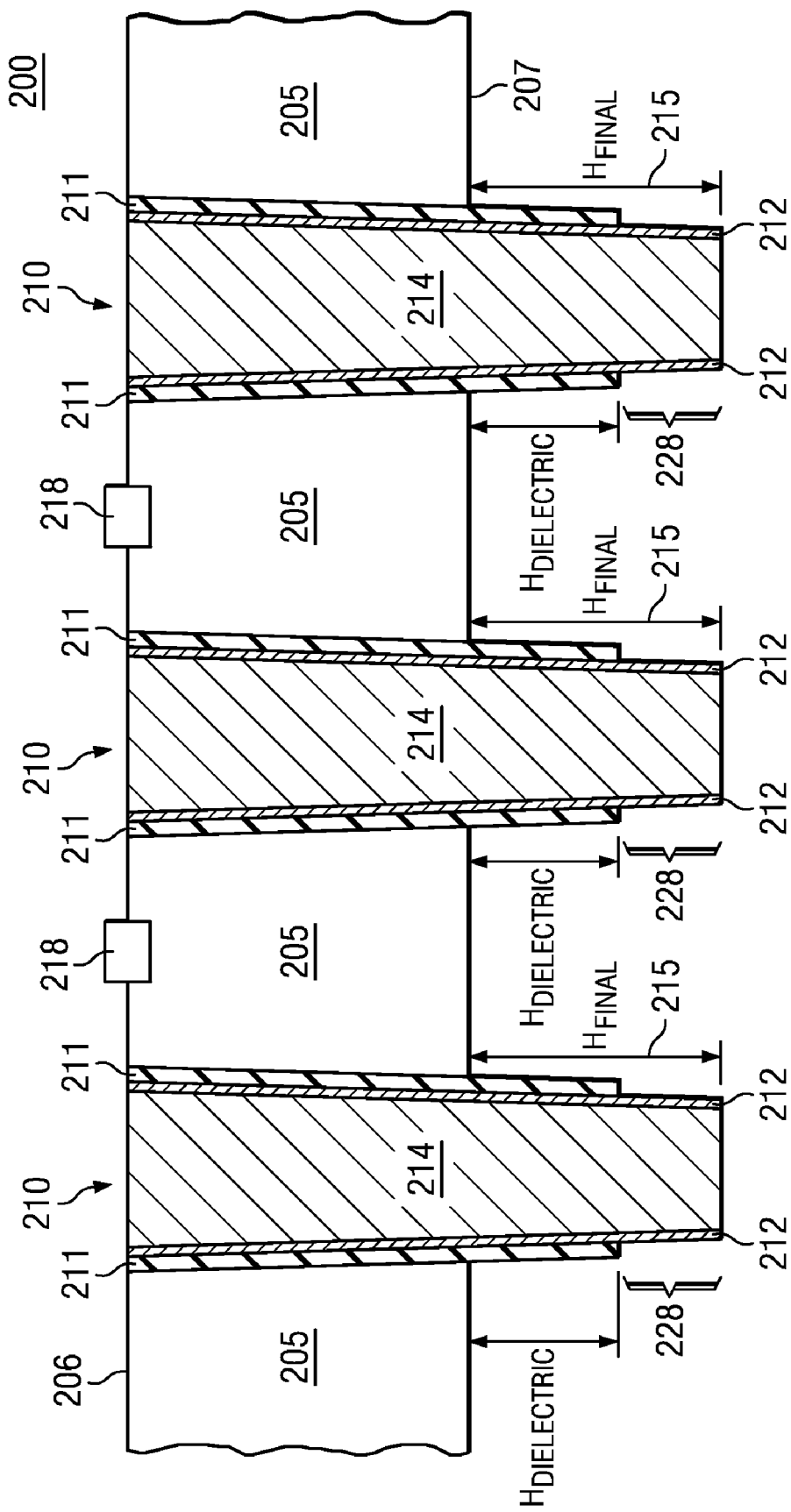
FIG. 2A is a simplified cross sectional depiction of an IC comprising a plurality of TSVs that have a dielectric liner including at least one metal gettering agent, according to an embodiment of the invention.

FIG. 2A is a simplified cross-sectional depiction of an IC 200 comprising a plurality of TSVs 210 that have a dielectric liner 211 including at least one metal gettering agent, according to an embodiment of the invention. Contact, metallization levels and passivation overcoat are omitted for clarity. IC 200 comprises a substrate 205 including a semiconductor top surface 206 and a bottom surface 207, wherein the top surface 206 includes one or more active circuit components 218 (e.g., transistors). The substrate 205 has a substrate thickness that is typically 50 to 100 μm (e.g., obtained by polishing), but can generally range between 5 and 200 μm.

The dielectric liner 211 generally comprises silicon oxide or silicon oxynitride that can be seen to be framing the TSVs 210 within substrate 205. The dielectric liner includes a metal gettering agent in an average concentration from 1 to 10 atomic %, and can comprise phosphorous or fluorine, for example. A refractory metal comprising diffusion barrier layer 212 is on the dielectric liner 211. A metal filler 214 generally comprising copper is on the metal comprising barrier layer 212 and substantially fills the TSVs 210. "Substantially fills" is meant to include the case of electroplated metals such as copper, wherein a center seam or void region on the order of about 1 μm can exist in the metal filler 214.

The TSVs 210 shown in FIG. 2A can be seen to extend from the top semiconductor surface 206 to an optional integral TSV tip 215 that protrudes from the bottom surface 207 of the substrate 205. The protruding integral TSV tip 215 comprises the electrically conductive filler material 214 and has a tip height shown as $H_{final}$ that can be from 1 to 50 μm. However, in cases of a redistribution layer (RDL), the TSV is generally polished flat so that there is no protruding TSV tip ($H_{final}$=0). In the RDL embodiment, the metal RDL layer is patterned over the TSV to reroute to another location prior to bonding. A height of the dielectric liner 211 is 10 to 100% of the tip height, and generally <100% to provide an exposed tip portion 228 that includes a sidewall tip portion on a distal end of the protruding integral TSV tip 215 for making electrical connection to an underlying workpiece. Although not shown, the TSVs 210 can include a surface finish such as electroless Ni/Pd or electroless Ni/Au with an outer surface of a readily solder wettable metal such as Pd or Au.

Figure 2B:
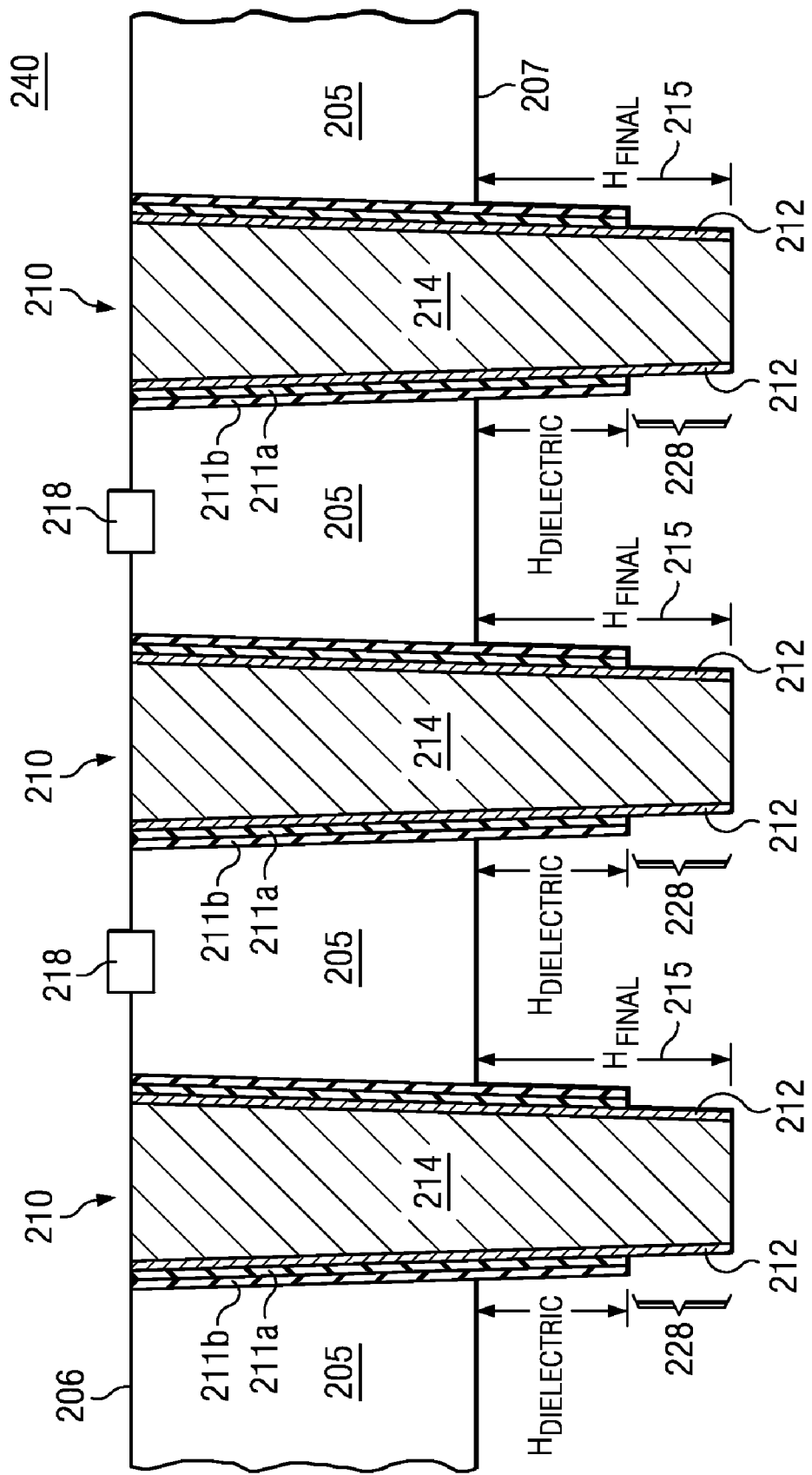
FIG. 2B is a simplified cross sectional depiction of an IC comprising a plurality of TSVs that have a dielectric liner comprising an inner dielectric liner portion having the metal gettering agent in a concentration from 1 to 10 atomic %, and an outer dielectric liner portion with <1 atomic % of a metal gettering agent, according to an embodiment of the invention.

FIG. 2B is a simplified cross-sectional depiction of an IC 250 comprising a plurality of TSVs that have a dielectric liner comprising an inner dielectric liner portion 211(*a*) with having a metal gettering agent in a concentration from 1 to 10 atomic %, and an outer dielectric liner portion 211(*b*) having <1 atomic % of a metal gettering agent, according to an embodiment of the invention. Besides the dielectric liner, IC 250 is otherwise equivalent to IC 200 depicted in FIG. 2A.

Figure 2C:
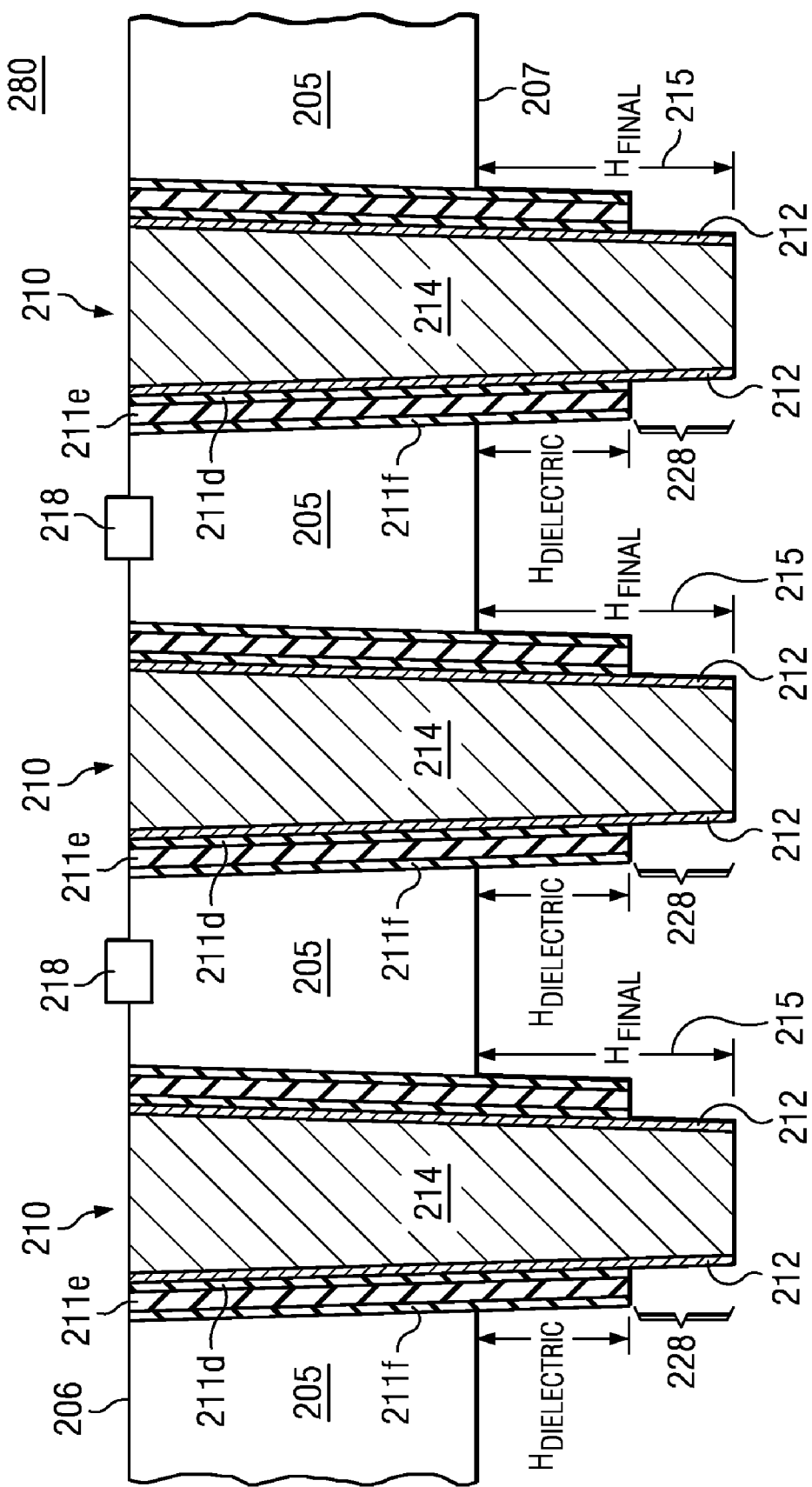
FIG. 2C is a simplified cross sectional depiction of an IC comprising a plurality of TSVs that have a dielectric liner comprising an inner dielectric liner portion with <1 atomic % of a metal gettering agent, an outer dielectric liner portion with <1 atomic % of an metal gettering agent, and center dielectric liner portion sandwiched between the inner and outer dielectric liner portions having the metal gettering agent in a concentration from 1 to 10 atomic %, according to another embodiment of the invention.

FIG. 2C is a simplified cross sectional depiction of an IC 280 comprising a plurality of TSVs that have a dielectric liner comprising an inner dielectric liner portion 211(*d*) with <1 atomic % of a metal gettering agent, an outer dielectric liner portion 211(*f*) with <1 atomic % of a metal gettering agent, and center dielectric liner portion 211(*e*) sandwiched between the inner and outer dielectric liner portions having the metal gettering agent in a concentration from 1 to 10 atomic %, according to another embodiment of the invention. The initial deposition (e.g., against silicon) of the outer dielectric liner portion 211(f) having low (<1%) gettering agent concentration avoids counter-doping of the semiconductor (e.g., silicon) when the metal gettering agent is a dopant in the semiconductor, and the final deposition of the inner dielectric liner portion 211(d) has advantages if it is undoped or nearly undoped <1 at. % as it will be less likely to react with ambient moisture while in queue for the subsequent barrier metal deposition. In a typical arrangement, center dielectric liner portion 211(e) is thicker than both inner dielectric liner portion 211(d) and outer dielectric liner portion 211(f). Besides the dielectric liner, IC 280 is otherwise equivalent to IC 200 depicted in FIG. 2A and IC 250 depicted in FIG. 2B.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method for fabricating an integrated circuit (IC), comprising:
providing a wafer including a top surface and a bottom surface;
etching said wafer to form a plurality of vias, said plurality of vias having a depth of at least 10 μm;
forming a dielectric liner to frame sidewalls and a bottom of said plurality of vias, wherein said dielectric liner includes at least a portion having at least one metal gettering agent comprising a halogen or a Group 15 element, and wherein said metal gettering agent is in a concentration from 1 to 10 atomic % in said dielectric liner;
forming a metal comprising diffusion barrier layer on said dielectric liner, and
forming a metal filler on said metal comprising diffusion barrier layer to fill said plurality of vias to form a plurality of TSVs.

2. The method of claim 1, wherein said etching comprises deep reactive-ion etching (DRIE).

3. The method of claim 1, wherein said etching is after contact level processing and before first metal processing.

4. The method of claim 3, wherein said etching is from said top surface, after said forming said metal filler said plurality of TSVs comprise a plurality of embedded TSVs, the method further comprising wafer removal processing from said back surface of said wafer to expose said embedded TSVs.

5. The method of claim 1, wherein said metal gettering agent comprises a phosphorus-doped oxide, an arsenic-doped oxide, or a fluorine-doped oxide.

6. The method of claim 1, wherein said dielectric liner comprises a polymeric dielectric.

7. The method of claim 1, wherein said forming a metal comprising diffusion barrier layer comprises physical vapor deposition (PVD).

8. The method of claim 1, wherein said top surface comprises silicon.

9. The method of claim 8, wherein said metal filler comprises copper.

10. The method of claim 1, wherein said metal comprising diffusion barrier layer comprises titanium, titanium nitride, tantalum, tantalum nitride, manganese, ruthenium, or combinations thereof.

11. The method of claim 1, wherein said forming a dielectric liner comprises depositing an outer dielectric liner portion with <1 atomic % of said metal gettering agent, and then depositing an inner dielectric liner portion on said outer dielectric liner portion to provide said portion having at least one metal gettering agent in a concentration from 1 to 10 atomic %.

12. The method of claim 1, wherein said forming a dielectric liner comprises depositing an outer dielectric liner portion with <1 atomic % of a metal gettering agent, depositing a center dielectric liner having the metal gettering agent in a concentration from 1 to 10 atomic %, and then depositing an inner dielectric liner portion with <1 atomic % of an metal gettering agent to sandwich said center dielectric liner portion between said inner and outer dielectric liner portions.

13. The method of claim 1, wherein an aspect ratio (AR) of said plurality of TSVs is <10.

14. A method for fabricating an integrated circuit (IC), comprising:
   providing a wafer including a top surface and a bottom surface;
   deep reactive-ion etching (DRIE) said wafer to form a plurality of vias, said plurality of vias having a depth of at least 10 μm;
   forming a dielectric liner to frame sidewalls and a bottom of said plurality of vias, wherein said dielectric liner includes at least a portion having at least one metal gettering agent comprising a halogen or a Group 15 element, and wherein said metal gettering agent is in a concentration from 1 to 10 atomic % in said dielectric liner;
   forming a metal comprising diffusion barrier layer using physical vapor deposition (PVD) on said dielectric liner, and
   forming a copper comprising filler on said metal comprising diffusion barrier layer to fill said plurality of via to form a plurality of TSVs.

* * * * *